(12) United States Patent
Mihnea et al.

(10) Patent No.: US 6,563,741 B2
(45) Date of Patent: May 13, 2003

(54) FLASH MEMORY DEVICE AND METHOD OF ERASING

(75) Inventors: Andrei Mihnea, San Jose, CA (US); Chun Chen, Boise, ID (US); Paul Rudeck, Boise, ID (US); Andrew R. Bicksler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 09/772,667

(22) Filed: Jan. 30, 2001

(65) Prior Publication Data

US 2002/0101765 A1 Aug. 1, 2002

(51) Int. Cl.⁷ .............................. G11C 16/04
(52) U.S. Cl. ............... 365/185.29; 365/185.3
(58) Field of Search ............... 365/185.29, 185.3, 365/185.23, 185.19, 185.27

(56) References Cited

U.S. PATENT DOCUMENTS

| | | | |
|---|---|---|---|
| 5,576,991 A | * 11/1996 | Radjy et al. ............. | 365/185.24 |
| 5,675,537 A | 10/1997 | Bill et al. | |
| 5,838,618 A | 11/1998 | Lee et al. | |
| 5,856,944 A | 1/1999 | Prickett, Jr. et al. | |
| 5,862,078 A | 1/1999 | Yeh et al. | |
| 5,903,499 A | 5/1999 | Peng et al. | |
| 5,912,845 A | * 6/1999 | Chen et al. ............... | 365/185.3 |
| 5,933,847 A | 8/1999 | Ogawa | |
| 5,963,477 A | * 10/1999 | Hung ..................... | 365/185.22 |
| 6,005,809 A | 12/1999 | Sung et al. | |
| 6,023,426 A | 2/2000 | Tang et al. | |
| 6,049,484 A | 4/2000 | Lee et al. | |
| 6,052,310 A | 4/2000 | Sunkavalli | |
| 6,055,183 A | 4/2000 | Ho et al. | |
| 6,172,915 B1 | 1/2001 | Tang et al. | |
| 6,222,770 B1 | 4/2001 | Roohparvar | |
| 6,236,596 B1 | 5/2001 | Sobek et al. | |
| 6,249,459 B1 | 6/2001 | Chen et al. | |
| 6,261,906 B1 | 7/2001 | Hsu et al. | |
| 6,261,907 B1 | 7/2001 | Chang | |
| 6,314,027 B1 | 11/2001 | Choi | |

\* cited by examiner

*Primary Examiner*—Michael S. Lebentritt
*Assistant Examiner*—Anh Phung
(74) *Attorney, Agent, or Firm*—Leffert Jay & Polglaze P.A.

(57) ABSTRACT

A non-volatile memory device includes an improved method for erasing a block of stack-gate single transistor flash memory cells. The memory performs an efficient and controllable mode of programming, referred to as block convergence. During an erase operation, one or more electrical erase pulses of fixed number, duration and voltage waveform are applied to memory cells in an addressable block of the memory device array. The erase pulse(s) fully erase all bits in the block. A block convergence operation is applied simultaneously to all cells in the block. The block convergence operation brings a threshold voltage of cells, which may have become over-erased during the erase operation, to a controlled level. A reverse-bias pulse, capable of inducing band-to-band tunnelling across one junction in the structure of the flash memory cells, is applied to a first junction. The other junction receives either a reverse bias or floating potential. The memory can implement several biasing schemes while performing the block convergence operation.

36 Claims, 7 Drawing Sheets

FLASH MEMORY DEVICE AND METHOD OF ERASING

TECHNICAL FIELD OF THE INVENTION

The present invention relates generally to non-volatile memories and in particular the present invention relates to erase operations in non-volatile memories.

BACKGROUND OF THE INVENTION

Electrically erasable and programmable read only memories (EEPROMs) are widely used in computer systems for storing data. The typical data storage element of an EEPROM is a floating gate transistor, which is a field-effect transistor (FET) having an electrically isolated (floating) gate that controls electrical conduction between source and drain regions. Data is represented by charge stored on the floating gate and the resulting conductivity obtained between source and drain regions.

For example, a floating gate memory cell can be formed in a P-type substrate with an N-type diffused source region and an N-type drain diffusion formed in the region. A floating gate, typically made of doped polysilicon, is located over the channel region and is electrically isolated from the other cell elements by oxide. For example, a thin gate oxide can be located between the floating gate and the channel region. A control gate is located over the floating gate and can also be made of doped polysilicon. The control gate is separated from the floating gate by a dielectric layer.

Flash memories typically have an array of non-volatile memory cells that are arranged in addressable blocks. The memory cells can be individually programmed, but are usually erased as a whole block. That is, any charge stored on the floating gate of a block of memory cells is removed using a common erase process. The process can be complex and time consuming. In a typical flash erase operation, a block of memory cells typically are first programmed to a high threshold voltage (placing charge on floating gate). Electrical erase pulses are then applied to the memory cells to remove the stored charges. A verification operation determines if the memory cells have a low threshold state (erased state). For the memory cells in the block that are in an over-erased condition, a procedure is implemented to raise the threshold voltage of over-erased cells. The erase operation, therefore, has multiple steps that require time and relatively complex circuitry.

For the reasons stated above, and for other reasons stated below which will become apparent to those skilled in the art upon reading and understanding the present specification, there is a need in the art for a non-volatile memory that can be erased using a simpler procedure.

SUMMARY OF THE INVENTION

The above-mentioned problems with memory devices and memory erase operations and other problems are addressed by the present invention and will be understood by reading and studying the following specification.

In one embodiment, a non-volatile memory device comprises an array of non-volatile memory cells, and control circuitry coupled to the array. The control circuitry performs an erase operation on the non-volatile memory cells. The erase operation consists of applying one or more erase pulses to the memory cells and performing a convergence operation to recover over-erased memory cells.

In a first embodiment, the non-volatile memory cells are floating gate transistors and the convergence operation comprises biasing a source region of the memory cells to ground potential and biasing a substrate body of the memory cells to negative potential. A positive voltage pulse having a predetermined duration and an upper voltage level is applied to a drain region of the memory cells, and a ramped voltage signal is applied to a control gate.

In a second embodiment, the non-volatile memory cells are floating gate transistors and the convergence operation comprises biasing a substrate body of the memory cells to ground potential and biasing a drain region of the memory cells to a positive potential, and applying a ramped voltage signal to a control gate.

In yet another embodiment, the non-volatile memory cells are floating gate transistors and the convergence operation comprises biasing a substrate body of the memory cells to ground potential and biasing a drain region of the memory cells to a first positive potential, biasing a control gate of the memory cells to a second positive potential, and applying a ramped voltage signal to a source region of the memory cells.

A method of erasing a block non-volatile memory cells comprises applying an erase voltage configuration to the block of floating gate transistor memory cells comprising source and drain regions, a channel formed in a body of the transistor between the source and drain regions, a floating gate, and a control gate. A convergence operation is performed on the block of memory cells to adjust memory cells that are over-erased during the application of the erase voltage configuration. The convergence operation comprises biasing the source region of the memory cells to ground potential, biasing the body to a negative potential, applying a positive voltage pulse having a predetermined duration in the range of 10 μs to 100 ms and an upper voltage level in a range of 2.5 to 5 volts to the drain region, and applying a ramped voltage signal having a duration in a range of 10 μs to 100 ms, a final voltage in a range of 0 to 4 volts, and an initial voltage in a range of −2 to 0 volts to the control gate.

A method of erasing a block non-volatile memory cells comprises applying an erase voltage configuration to the block of floating gate transistor memory cells comprising source and drain regions, a channel formed in a body of the transistor between the source and drain regions, a floating gate, and a control gate. A convergence operation is performed on the block of memory cells to adjust memory cells that are over-erased during the application of the erase voltage configuration. The convergence operation comprises floating the source region of the memory cells, biasing the body to ground, applying a voltage in a range of 6 to 9 volts to the drain region, and applying a ramped voltage signal having a duration in a range of 10 μs to 100 ms, a final voltage in a range of 1 to 4 volts, and an initial voltage of about 0 volts to the control gate.

A method of erasing a block non-volatile memory cells comprises applying an erase voltage configuration to the block of floating gate transistor memory cells comprising source and drain regions, a channel formed in a body of the transistor between the source and drain regions, a floating gate, and a control gate. A convergence operation is performed on the block of memory cells to adjust memory cells that are over-erased during the application of the erase voltage configuration. The convergence operation comprises floating the source region of the memory cells, biasing the body to ground, applying a voltage in a range of 6 to 9 volts to the drain region, and applying a voltage in a range of 0.5 to 3 volts to the control gate.

A method of erasing a block non-volatile memory cells comprises applying an erase voltage configuration to the block of floating gate transistor memory cells comprising source and drain regions, a channel formed in a body of the transistor between the source and drain regions, a floating gate, and a control gate. A convergence operation is performed on the block of memory cells to adjust memory cells that are over-erased during the application of the erase voltage configuration, the convergence operation comprises biasing the body to ground, applying a constant voltage in a range of 2 to 5 volts to the control gate, applying another constant voltage in the range of 3–6 volts to the drain, and applying a ramped voltage signal having a duration in a range of 10 μs to 100 ms, a final voltage of about 0 volts, and an initial voltage in a range of 2 to 5 volts to the source region.

Other embodiments of the present invention are described herein. The above summary is not intended to cover all aspects of the present invention and the present invention is provided in the claims.

DETAILED DESCRIPTION OF THE INVENTION

Figure 1:
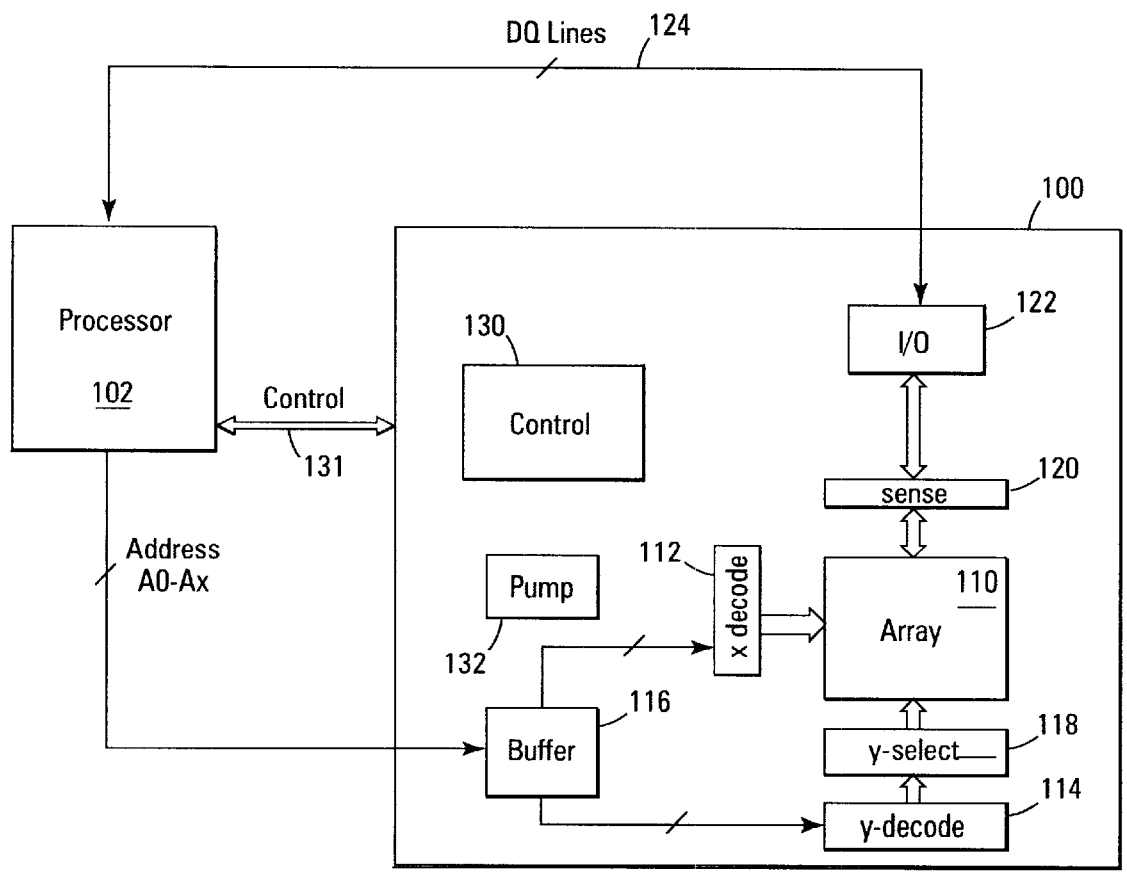
FIG. 1 is a block diagram of a flash memory device of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Flash Memory Device

FIG. 1 illustrates a block diagram of a flash memory device 100 that is coupled to a controller 102. The memory device has been simplified to focus on features of the memory that are helpful in understanding the present invention. The memory device includes an array of memory cells 110. The memory cells are preferably floating gate memory cells, and the array is arranged blocks of rows and columns. The blocks allow memory cells to be erased in large groups. Data, however, is stored in the memory array in small data groups (byte or group of bytes) and separate from the block structure. Erase operations are usually performed on a large number of cells in parallel.

An x-decoder 112 and a y-decoder 114 are provided to decode address signals provided on. address lines A0–Ax. Address signals are received and decoded to access the memory array. An address buffer circuit 116 is provided to latch the address signals. A y-select circuit 118 is provided to select a column of the array identified with the y-decoder 114. Sense amplifier and compare circuitry 120 is used to sense data stored in the memory cells and verify the accuracy of stored data. Data input and output buffer circuits 122 are included for bidirectional data communication over a plurality of data (DQ) lines 124 with the processor. Command-control circuit 130 decodes signals 131 provided on control lines from the processor. These signals are used to control the operations of the memory, including data read, data write, and erase operations. A state machine(s) can be provided as part of the control circuitry to perform read, write and erase operations. The flash memory may include a charge pump circuit 132 that generates an elevated voltage, Vpp, used during programming of the memory cells and other internal operations. During write operations, Vpp is coupled to the memory cells for providing appropriate write operation programming power. Charge pump designs are known to those skilled in the art, and provides power which is dependant upon an externally provided supply voltage Vcc.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using numerous flash memories.

Conventionally, a flash cell is programmed by charging a floating gate of the flash cells. Hot electrons are drawn from the flash cells' channel regions into the floating gates by applying relatively high drain-to-source and gate-to-source voltage pulses to the flash cells. For example, the drain-to-source and gate-to-source voltage pulses could have typical amplitudes of respectively five and eleven volts, and minimum amplitudes of zero volts. These gate-to-source and drain-to-source voltage pulses may have pulse widths of twelve microseconds and ten microseconds, respectively. When the amplitude of the gate-to-source voltage pulse is minimum, the flash cell operates in its cut-off region. When the amplitude of the gate-to-source voltage pulse is at a maximum, the flash cell operates in its linear region because the threshold of an erased or unprogrammed flash cell is typically about three volts. During the transition of the gate-to-source voltage pulse between minimum and maximum amplitudes, the flash cell operates briefly in its saturated region.

In both the saturated and linear regions, flash cells generate hot electrons in the channel current that travel at a saturated or maximum velocity, and thus have high energy. Hot electrons arise in the channels of flash cells because the drain-to-source voltages are sufficiently high, and the flash cells' gate lengths are sufficiently small. Hot electrons in the channel current form a programming current used to program the flash cell. The programming current is the emission of hot electrons from a flash cell channel region into its floating gate.

Erase and Convergence Operations

An improved method for erasing a block. of stack-gate single transistor flash memory cells is possible by using an efficient and controllable mode of programming, referred to herein as block convergence. One embodiment of a method of the present invention is illustrated in the flow chart of FIG. 2. In the first operation 200 of the method, one or more electrical erase pulses of fixed number, duration and voltage waveform are applied to memory cells in an addressable block of the memory device array. The erase pulse(s) are designed to ensure full erasure of all bits in the block over possible statistical variations. The statistical variations include possible reduction in erasure speed resulting from programming and erase cycling during the life of the memory device.

As an example, the block of memory cells can be erased by applying one or more erase pulses using a source erase operation. In this example, a source voltage of about six (6) volts is applied to the memory cell source, the drain region is left floating, the substrate is at ground, and the control gate is at minus ten (−10) volts. These voltages are applied to the memory cells for 100 $\mu$s to 10 s. The exact voltages and duration of the source erase operation can vary without departing from the present invention. A second type of erase operation uses the channel and control gate to erase the memory cell. The memory cell blocks in this memory device are fabricated in isolated p-wells. During the erase operation, the control gate is biased to about minus ten (−10) volts, the p-well is biased to about eight (8) volts, and the source and. drain are floated. In both types, of erase biasing, a sufficient differential is provided across the floating gate to remove a negative charge stored thereon. The magnitude and duration of the differential can be selected to insure that all cells in a block are erased.

Figure 2:
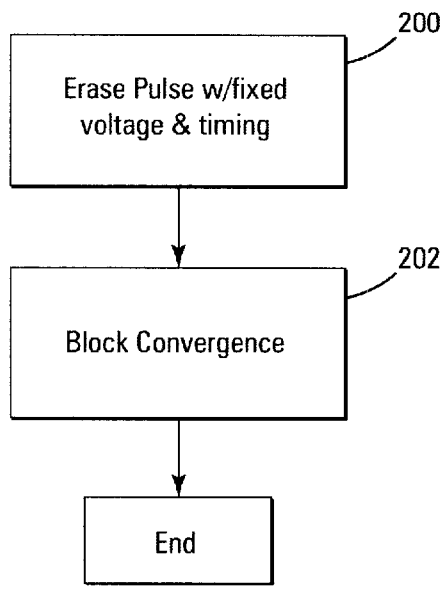
FIG. 2 is a flow chart of an erase operation of one embodiment of the present invention.

The method of FIG. 2 also includes a block recovery operation 202, or convergence operation, that is applied simultaneously to all cells in the block. The block convergence operation is designed to bring the threshold voltage of cells that may have become over-erased during the erase operation to a controlled level. This recovery operation may be implemented as a low current simultaneous and convergent programming for all the cells in the block. Several biasing schemes are described herein for performing the block convergence operation.

Figure 3:
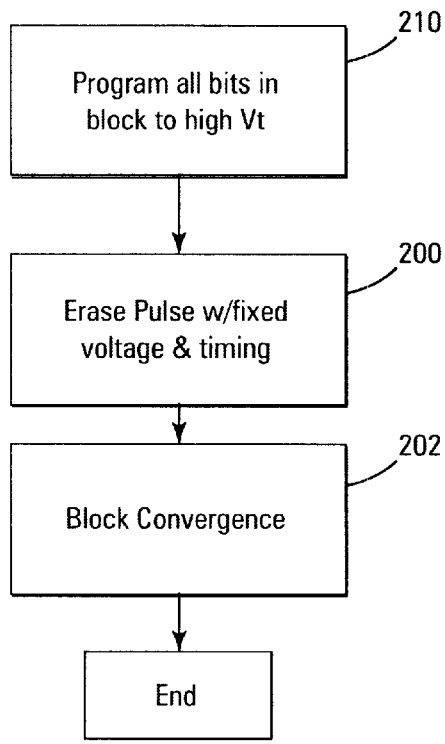
FIG. 3 is another flow chart of an erase operation of one embodiment of the present invention.
Figure 4:
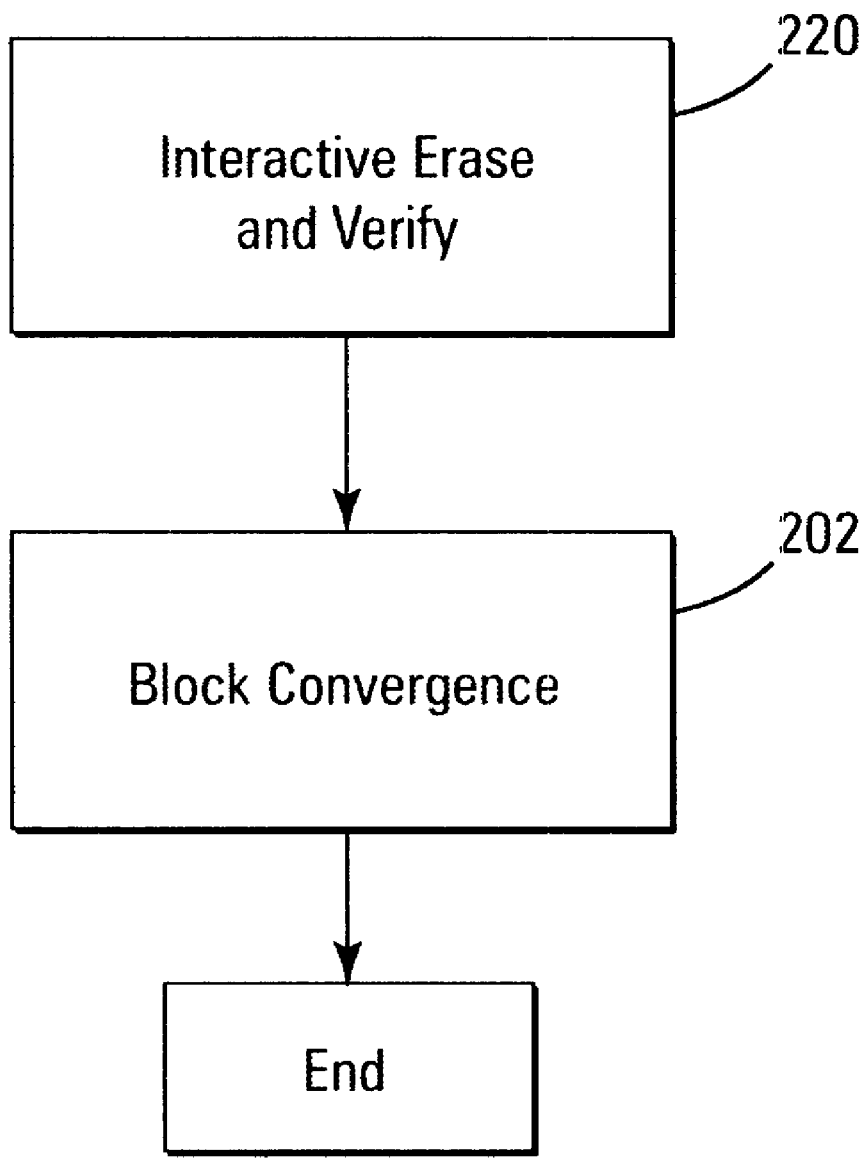
FIG. 4 is another flow chart of an erase operation of one embodiment of the present invention.

Alternatively, methods illustrated in FIGS. 3 and 4 may be used if the efficiency of the above block convergence operation is not sufficient for a particular memory device. The embodiment of FIG. 3 adds a pre-program operation 210 to program all memory cells in a block to a high Vt. The embodiment of FIG. 4 includes a verify operation 220 to the erase function. These embodiments and their sub-operations are described in greater detail below.

Figure 5:
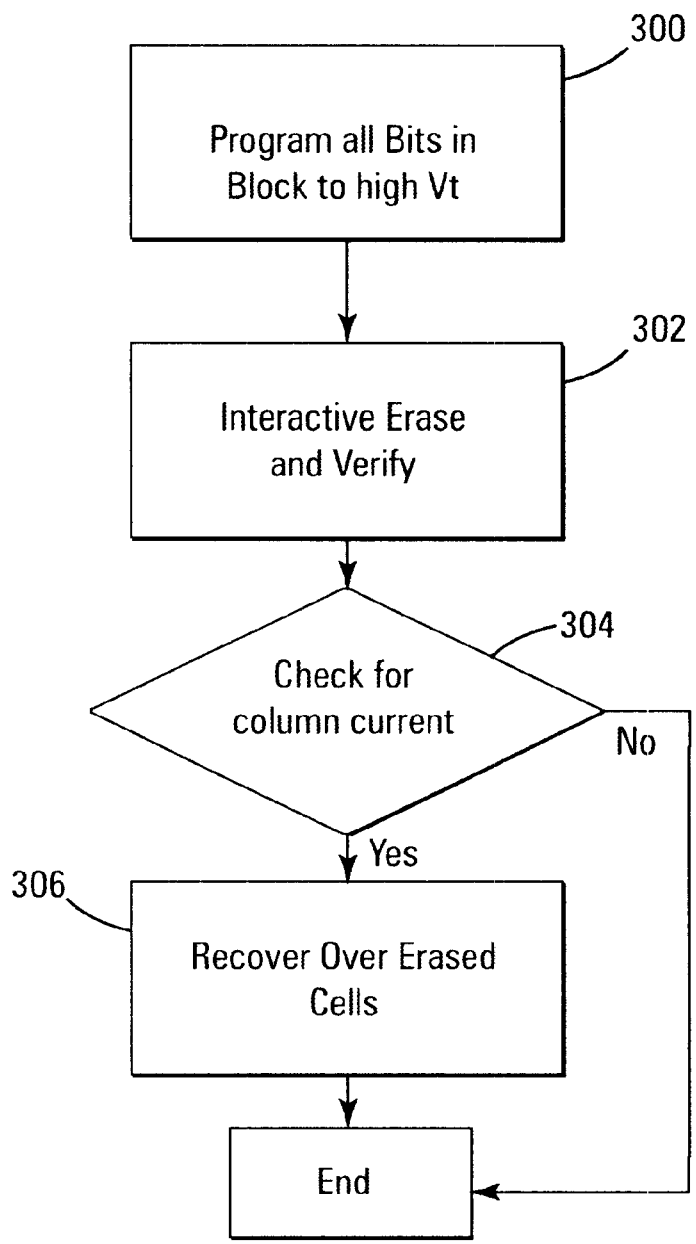
FIG. 5 is a flow chart of a prior art erase operation.
Figure 6:
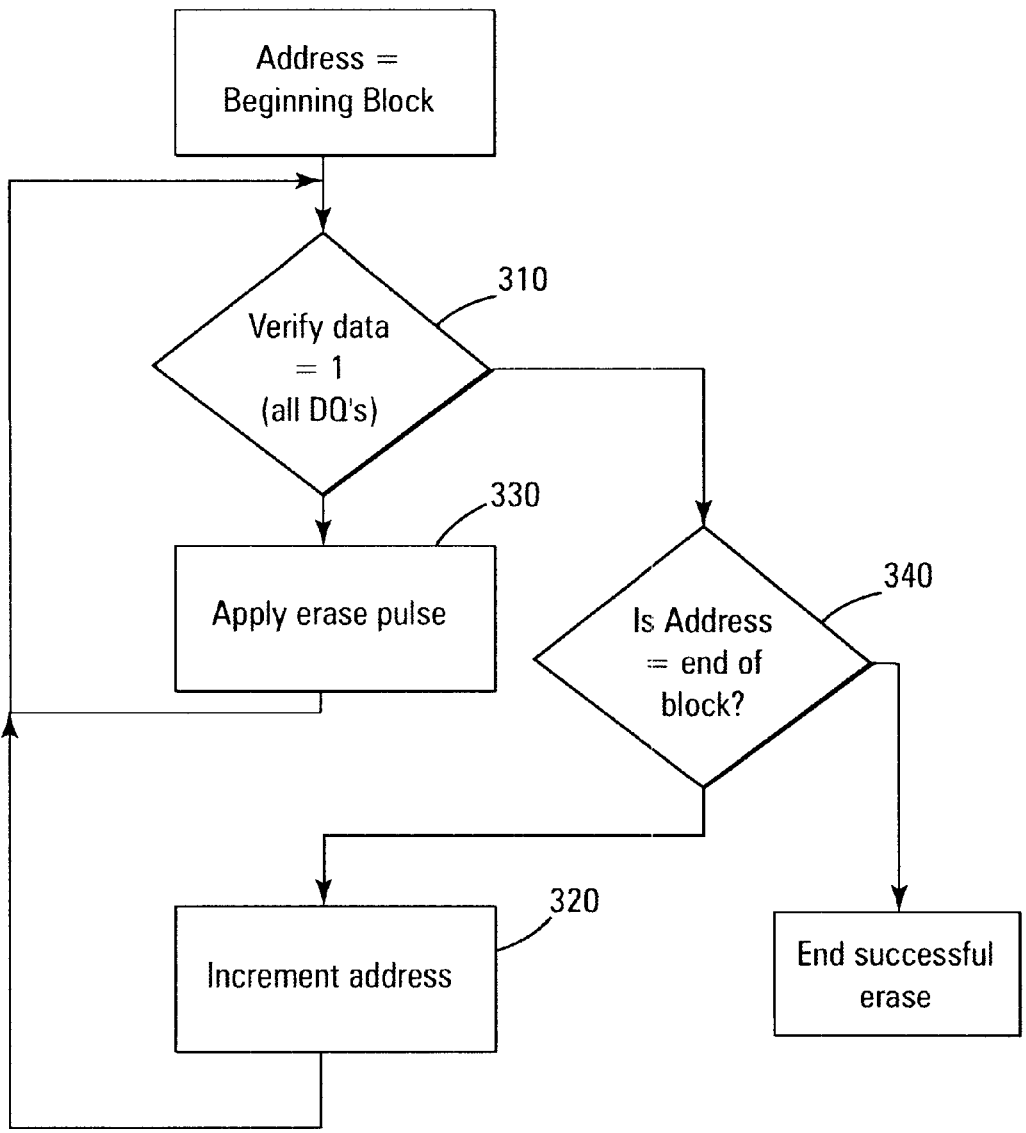
FIG. 6 is a more detailed flow chart of a sub-operation of the prior art erase operation of FIG. 5.

In contrast to the present invention, the prior art erase operation for a block of stacked-gate single transistor flash memory cells typically includes the steps illustrated in FIG. 5. First, all of the memory cells in a block are pre-programmed 300 to have a high threshold voltage (place a negative charge on the floating gate). A sequence of electrical erase pulses are applied 302 to the cells to remove the floating gate charge. An example of this operation is detailed in FIG. 6. The condition of all cells in the block is determined in conjunction with the application of the erase pulses. That is, a verification 310 is performed to determine that all data lines are a logic one (memory cells have reached a low threshold or conductive state). Once the memory cells have reached an erased state (logic one), the application of the erase pulses is stopped. As shown in FIG. 6, the memory address is advanced 320 and the verification operation is repeated. Additional erase pulses are applied 330 until the new data lines are logic one. The process is completed when the address boundary of the block is reached 340. The verification operation is intended to reduce the chance that the cells are over-erased. If the memory cells reach an over-erased state, they may conduct current without applying a voltage to the control gate. Referring again to FIG. 5, after the interactive erase and verify step 302, all columns in the block are checked for any excess current 304 which would be caused by an over-erased condition in any of the cells. If such excess column current is found, a procedure 306 is implemented to raise the threshold voltage of the cells in columns containing over-erased cells.

The above prior art erase algorithm has been proven to allow extensive program/erase cycling with very low failure rate for current stacked-gate single transistor flash cell technologies. The process, however, has some disadvantages. An analog verify function, in addition to the basic analog read function, is required for the memory. A sequence of complex logic functions is required, such as automatic scanning of the address space for each block of flash memory, and repeated verification and decision making. Implementing these functions increases the size and complexity of the peripheral circuitry associated with the stacked-gate single transistor flash memory. As such, the memory is less efficient, more expensive and more difficult to design than the periphery of comparable split-gate single transistor memories or double-transistor memory, as known to those in the art. In addition, the execution of these functions requires time in excess of the time required for the intrinsic erase operation, thus slowing down the operation for the memory. Finally, the procedure to recover over-erased cells sometimes either fails to raise the threshold enough, or raises it too much, causing the erase operation to fail.

The present invention uses high-efficiency programming at low gate voltage that is attributed to secondary ionization. A convergence scheme based on this programming mode was proposed to replace the column current check and over erase recovery steps of the standard erase algorithm, as described above, see C. Y. Hu et al., "Substrate Current Induced Hot Electron Injection: A New Convergence Scheme for Flash Memory", 1995 IEDM Tech. Digest, p. 283. In that implementation, all cells in a block are biased in weak conduction with one junction (drain to substrate) at high reverse voltage for hot-electron generation, while the other junction is reverse biased, and the gate is kept at constant, low "on" voltage. This bias scheme provides a high enough program efficiency for the convergence operation to be applicable simultaneously on all cells in an erase block. The first steps of the erase algorithm are performed like the standard sequence of FIG. 5. That is, the pre-program and erase/verify operations were included in the erase operation. The programming efficiency for the convergence operation described in this erase operation, however, is not high enough to afford the change of the erase algorithm to one of the simpler sequences depicted in FIGS. 2 to 4. In contrast, the present invention provides a convergence operation that increases the programming efficiency.

The present invention further enhances the efficiency of programming using secondary ionization by increasing both the horizontal and vertical electric fields in the channel by using higher doping concentration in the channel near the junction where the primary hot-electrons are generated (e.g. drain-to-substrate junction), see below description. For example, a doped concentration region can be provided in the p-type channel region adjacent to the drain that has a concentration level of about $10^{18}/cm^3$. A typical channel region has a concentration level up to about $5 \times 10^{17}/cm^3$.

In operation, the present invention also biases the cells at a high enough voltage across one junction (e.g., the drain-to-substrate junction) to induce hot-electron action and secondary ionization by holes in the substrate current. A smaller reverse bias is provided on the other junction (e.g., source to substrate junction) to enable the high efficiency programming mode. The gate voltage is linearly increased to keep the channel current at a low and constant value throughout a program process. In an alternate embodiment, the memory cells are biased at constant voltage, or constant band-to-band current, across one junction (e.g., the drain-to-substrate junction) with zero current flowing across the other junction (e.g., floating source potential). A low constant, or linearly increasing, gate voltage with respect to the substrate is applied. A similar bias scheme has been described for full block programming by hot carrier injection in flash memory in U.S. Pat. No. 5,491,657 issued Feb. 13, 1996, and entitled "Method for Bulk (or Byte) Charging and Discharging an Array of Flash EEPROM Memory Cells."

Figure 7:
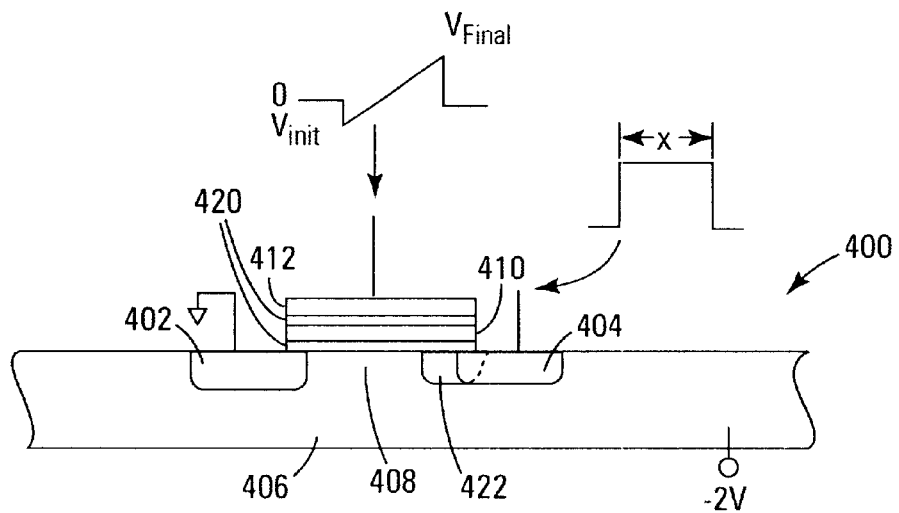
FIG. 7 is a cross-section of a non-volatile memory cell of one embodiment of the present invention.
Figure 8:
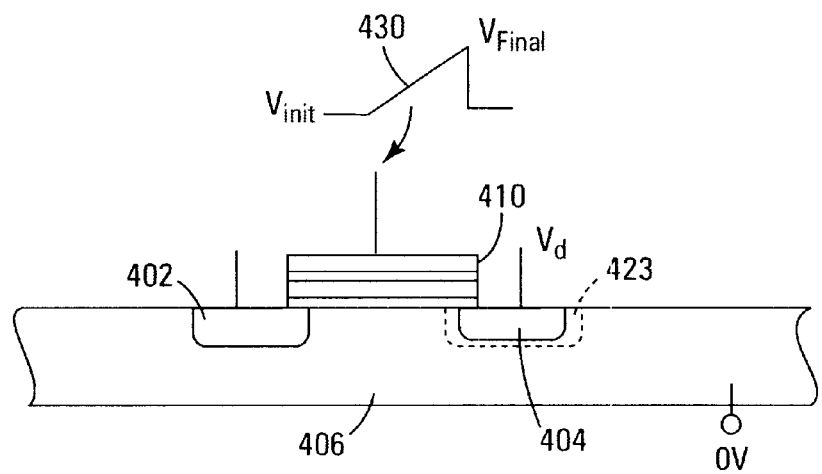
FIG. 8 is a cross-section of a non-volatile memory cell of another embodiment of the present invention.
Figure 9:
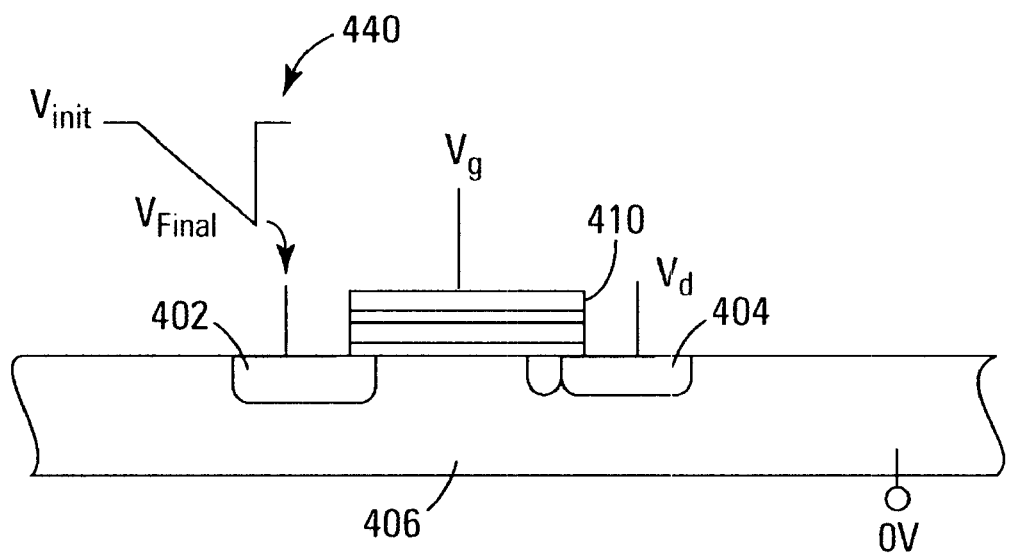
FIG. 9 illustrates an alternate convergence bias scheme of one embodiment of the present invention.

FIGS. 7, 8, and 9 illustrate simplified cross-section views of a floating gate memory cell 400 of the present invention. The memory cell has source 402 and drain 404 regions formed in a substrate 406. The source and drain regions can be n-type and the substrate p-type. A channel region 408 is defined between the source and drain. A floating gate 410 is located above the channel region. Further, a control gate 412 is located above the floating gate. The floating gate is isolated from the source, drain, channel and control gate using a dielectric material(s) 420. As indicated above, both horizontal and vertical electric fields in the channel are increased during the convergence operation by providing a higher doping concentration region 422 in the channel near the drain 404 where the primary hot-electrons are generated. Thus, a P+ region 422 is formed in the channel near the drain region. An alternate embodiment of the P+ region 423 is illustrated in FIG. 8. Region 422 can be formed using angled implantation, such as boron implantation. Conversely, region 423 can be formed using implantation and diffusion prior to drain implantation. It will be appreciated that both embodiments are interchangable.

At least three alternate bias schemes are described below that can be used during the block convergence operation. Each scheme used a ramped control gate voltage. By ramping the control gate in either of the methods of the present invention, the threshold voltage for all cells in the block is allowed to increase at a constant rate equal to that of the ramp. This ensures that the cell current is constant, low and approximately equal for all cells in the block. Further, the threshold voltage for all cells at the end of the process does not exceed a maximum voltage on the ramp, Vfinal.

The first embodiment (FIG. 7) biases the source region 402 to ground potential and the substrate body 406 to approximately −2 volts. The drain 404 recieves a positive voltage pulse having a predetermined duration, X, and an upper voltage level. In one embodiment the duration is in the range of 10 $\mu$s to 100 ms and the upper voltage level is in the range of 2.5 to 5 volts. As such the drain to substrate is more heavily reverse biased than the source to substrate. A ramped voltage signal is applied to the control gate in synchronization to-the drain pulse. The gate signal begins at an initial level Vinit and then linearly increases to a Vfinal level. In one embodiment, Vinit is in the range of −2 to 0 volts, Vfinal is in the range of 0 to 4 volts and the linear ramp time is synchronized with the drain voltage signal. This bias scheme provides hot electron generation at the drain-to-substrate junction and a low constant channel current to provide an efficient convergent operation.

In the embodiment illustrated in FIG. 8, the source region 402 is floated and the substrate body 406 is biased to ground (0 volts). The drain recieves a constant positive voltage, Vd, or a steady drain current. For example, a bias range of 6 to 9 volts, such as 8 volts, may be applied to the drain. In another embodiment, a constant current such as 10 mA can be applied to the drains of a 1M array block. As such the drain to substrate is more heavily reverse biased than the source to substrate. A constant low voltage may be applied to the control gate. For example, a control gate voltage in the range of 0.5 to 3 volts may be used. In one embodiment, the gate voltage is about 2 volts. Alternatively, a ramped voltage signal 430 can be applied to the control gate 410. The ramped gate signal begins at an initial voltage, Vinit, and then linearly increases to a Vfinal level. In one embodiment the initial voltage is ground, Vfinal is in the range of 1 to 4 volts, and the linear ramp time is in the range of 10 $\mu$s to 100 ms. By using any of the above bias schemes with the described floating gate memory cell, a more efficient programming convergence can be achieved and the erase operations of FIGS. 2 to 4 can be used. This bias scheme provides hot carrier generation by band-to-band tunneling and field acceleration at the drain-to-substrate junction and provides an efficient convergent operation.

An alternate convergence bias scheme is illustrated in FIG. 9. In this scheme, the substrate body 406 is at ground, the drain 404 is biased with Vd in the same manner as FIG. 8, and the control gate 441 is coupled to a constant voltage, Vg, such as 2 to 5 volts. A linear negative ramp voltage 440 is coupled to the source region of the memory cell. In one embodiment, the source signal starts at an initial voltage Vinit in the range of the control gate voltage, such as 2 to 5 volts, and decreases to a voltage, Vfinal, in the range of zero volts. The source signal linear negative ramp time is in the range of 10 $\mu$s to 100 ms. The negative voltage ramp applied to the source in conjunction with the constant gate voltage in this bias scheme are expected to have the same effect as the constant source voltage in conjuction with the positive gate voltage ramp in the bias scheme in FIGS. 7 and 8, i.e., maintain the drain current consumption and efficiency of hot electron injection to the floating gate constant through the time of the convergence pulse.

With higher efficiency programming at lower cell current, more cells can be simultaneously programmed. For instance, assuming that a cell requires about 1 ms to program at a current of 100 nA or less, a block of memory cells (typically 256,000 to 1,000,000 cells) can be recovered from an over-erased state in a relatively short total time of about 10 ms or less using any of the above described bias schemes and a current supply limited to about 10 mA. With the present invention, it is possible to eliminate the pre-program, erase verify and check column current operations from an erase algorithm, as described with reference to FIG. 2. Instead, the erase operation is transformed into an erase operation similar to that in standard EEPROMs, with fixed voltage waveform and duration designed to ensure full erasure for all cells in the block. In order to obtain such full erasure over variations in erase speed due to random differences in cell characteristics and/or changes in cell characteristics induced by program/erase cycling, the erase operation of the present invention is expected to lead to overerasure in a large number of cells. Block recovery, therefore, is unconditionally applied to the block in order to successfully recover all over-erased cells and ensure convergence of the threshold voltage for all cells in the block.

If the efficiency of the present convergence function is not high enough for a particular application to sustain the elimination of both the preprogram and erase verify operations from the erase sequence, an embodiment can be implemented in which only one of the operations is eliminated, see FIGS. 3 and 4.

The present operations are expected to allow stable operation for a block of flash memory over program/erase cycling. That is, a statistical distribution of threshold voltages for the cells in a block after the application of the present invention is the same, independent of a distribution of threshold voltages for the same block prior to the erase operation. In other words, the amount of floating gate charge for a block of memory cells assumes the same statistical distribution after an erase operation by any of the sequences depicted in FIGS. 2 to 4, independent of the data pattern written on the block prior to the erasure.

The threshold voltage of the cells in the block at the end of the convergence operation in either of the above embodiments is controlled by the value of the gate voltage at the end of the operation, Vfinal. A higher Vfinal level results in a higher threshold voltage after convergence. Thus, the threshold voltage control for the flash cells in the described block convergence function is more accurate than in many implementations of an over-erase-recovery function for a standard erase algorithm. Consequently, the present erase algorithm can be expected to yield even more robust operation with lower failure rate for the memory device than the standard erase algorithm.

Conclusion

A non-volatile memory device has been described that includes an improved method for erasing a block of stack-gate single transistor flash memory cells. The memory performs an efficient and controllable mode of programming, referred to as block convergence. During an erase operation, one or more electrical erase pulses of fixed number, duration and voltage waveform are applied to memory cells in an addressable block of the memory device array. The erase pulse(s) fully erase all bits in the block. A block convergence operation is applied simultaneously to all cells in the block. The block convergence operation brings a threshold voltage of cells, which may have become over-erased during the erase operation, to a controlled level. A reverse-bias pulse, capable of inducing band-to-band tunnelling across one junction in the structure of the flash memory cells, is applied to a first junction. The other junction receives either a reverse bias or floating potential. Several biasing schemes are described herein for performing the block convergence operation.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:

an array of non-volatile memory cells; and control circuitry coupled to the array to perform an erase operation on the non-volatile memory cells, wherein the erase operation consists of applying one or more erase pulses to the non-volatile memory cells and performing a convergence operation to recover over-erased non-volatile memory cells, wherein the convergence operation comprises holding a substrate body of the non-volatile memory cells at a constant voltage, and applying a variable voltage to another input of the non-volatile memory cells.

2. The non-volatile memory device of claim 1, wherein the control circuitry applies the variable voltage to a control gate of the non-volatile memory cells.

3. The non-volatile memory device of claim 1, wherein the control circuitry applies the variable voltage to a source region of the non-volatile memory cells.

4. A non-volatile memory device comprising:

an array of non-volatile memory cells; and control circuitry coupled to the array to perform an erase operation on the non-volatile memory cells, wherein the erase operation consists of applying one or more erase pulses to the non-volatile memory cells and performing a convergence operation to recover over-erased memory cells, wherein the non-volatile memory cells are floating gate transistors and the convergence operation comprises biasing a source region of the non-volatile memory cells to ground potential and biasing a substrate body of the non-volatile memory cells to negative potential, applying a positive voltage pulse having a predetermined duration and an upper voltage level to a drain region of the non-volatile memory cells, and applying a ramped voltage signal to a control gate.

5. The non-volatile memory device of claim 4 wherein the predetermined duration is in a range of 10 $\mu$s to 100 ms and the upper voltage level is in a range of 2.5 to 5 volts.

6. The non-volatile memory device of claim 4 wherein a duration of the ramped voltage signal is in a range of 10 $\mu$s to 100 ms and a final voltage of the ramped voltage signal is in a range of 0 to 4 volts.

7. The non-volatile memory device of claim 6 wherein an initial voltage of the ramped voltage signal is in a range of −2 to 0 volts.

8. The non-volatile memory device of claim 4 wherein a substrate body of the non-volatile memory cells is biased to about −2 volts.

9. A non-volatile memory device comprising:

an array of non-volatile memory cells; and control circuitry coupled to the array to perform an erase operation on the non-volatile memory cells, wherein the erase operation consists of applying one or more erase pulses to the non-volatile memory cells and performing a convergence operation to recover over-erased non-volatile memory cells, wherein the non-volatile memory cells are floating gate transistors and the convergence operation comprises biasing a substrate body of the non-volatile memory cells to ground potential and biasing a drain region of the non-volatile memory cells to a positive potential, and applying a ramped voltage signal to a control gate.

10. The non-volatile memory device of claim 9 wherein the positive potential is in a range of 6 to 9 volts.

11. The non-volatile memory device of claim 9 wherein a duration of the ramped voltage signal is in a range of 10 μs to 100 ms and a final voltage of the ramped voltage signal is in a range of 1 to 4 volts.

12. The non-volatile memory device of claim 11 wherein an initial voltage of the ramped voltage signal is 0 volts.

13. A non-volatile memory device comprising:

an array of non-volatile memory cells; and control circuitry coupled to the array to perform an erase operation on the non-volatile memory cells, wherein the erase operation consists of applying one or more erase pulses to the non-volatile memory cells and performing a convergence operation to recover over-erased non-volatile memory cells, wherein the non-volatile memory cells are floating gate transistors and the convergence operation comprises biasing a substrate body of the non-volatile memory cells to ground potential and biasing a drain region of the non-volatile memory cells to a first positive potential, biasing a control gate of the non-volatile memory cells to a second positive potential, and applying a ramped voltage signal to a source region of the non-volatile memory cells.

14. The non-volatile memory device of claim 13 wherein the first positive potential is in the range of 6 to 9 volts and the second positive potential is in the range of 0.5 to 3 volts.

15. A non-volatile memory device comprising:

an array of non-volatile memory cells; and control circuitry coupled to the array to perform an erase operation on the non-volatile memory cells, wherein the erase operation consists of applying one or more erase pulses to the non-volatile memory cells and performing a convergence operation to recover over-erased non-volatile memory cells, wherein the non-volatile memory cells are floating gate transistors and the convergence operation comprises biasing a substrate body of the non-volatile memory cells to ground potential, biasing a drain region of the non-volatile memory cells to a first positive potential, and biasing a control gate of the non-volatile memory cells to a second positive potential, the convergence operation further comprises applying a ramped voltage signal to a source of the memory cells.

16. The non-volatile memory device of claim 15 wherein the first positive potential is in the range of 6 to 9 volts and the second positive potential is in the range of 2 to 5 volts.

17. A non-volatile memory device comprising:

an array of floating gate transistor memory cells comprising source and drain regions, a channel formed in a body of the transistor between the source and drain regions, a floating gate, and a control gate; and erase circuitry coupled to the array to perform an erase operation on the floating gate transisitor memory cells, wherein the erase operation consists of applying one or more erase pulses to the floating gate transistor memory cells and performing a convergence operation to recover over-erased floating gate transistor memory cells, wherein the convergence operation comprises biasing the source region of the floating gate transistor memory cells to ground potential and biasing the body to a negative potential, the convergence operation further comprises applying a positive voltage pulse having a predetermined duration in the range of 10 μs to 100 ms and an upper voltage level in a range of 2.5 to 5 volts to the drain region, and applying a ramped voltage signal having a duration in a range of 10 μs to 100 ms, a final voltage in a range of 0 to 4 volts, and an initial voltage in a range of −2 to 0 volts to the control gate.

18. The non-volatile memory device of claim 17 wherein the body is p-type and the channel comprises a p+ region adjacent the drain region.

19. A non-volatile memory device comprising:

an array of floating gate transistor memory cells comprising source and drain regions, a channel formed in a body of the transistor between the source and drain regions, a floating gate, and a control gate; and erase circuitry coupled to the array to perform an erase operation on the floating gate transistor memory cells, wherein the erase operation consists of applying one or more erase pulses to the floating gate transistor memory cells and performing a convergence operation to recover over-erased floating gate transistor memory cells, wherein the convergence operation comprises floating the source region of the floating gate transistor memory cells and biasing the body to ground, the convergence operation further comprises applying a voltage in a range of 6 to 9 volts to the drain region, and applying a ramped voltage signal having a duration in a range of 10 μs to 100 ms, a final voltage in a range of 1 to 4 volts, and an initial voltage of about 0 volts to the control gate.

20. The non-volatile memory device of claim 19 wherein the body is p-type and the channel comprises a p+ region adjacent the drain region.

21. A non-volatile memory device comprising:

an array of floating gate transistor memory cells comprising source and drain regions, a channel formed in a body of the transistor between the source and drain regions, a floating gate, and a control gate; and erase circuitry coupled to the array to perform an erase operation on the floating gate transistor memory cells, wherein the erase operation consists of applying one or more erase pulses to the floating gate transistor memory cells and performing a convergence operation to recover over-erased floating gate transistor memory cells, wherein the convergence operation comprises floating the source region of the floating gate transistor memory cells and biasing the body to ground, the convergence operation further comprises applying a voltage in a range of 6 to 9 volts to the drain region, and applying a voltage in a range of 0.5 to 3 volts to the control gate.

22. The non-volatile memory device of claim 21 wherein the body is p-type and the channel comprises a p+ region adjacent the drain region.

23. A non-volatile memory device comprising:

an array of floating gate transistor memory cells comprising source and drain regions, a channel formed in a body of the transistor between the source and drain regions, a floating gate, and a control gate; and erase circuitry coupled to the array to perform an erase operation on the floating gate transistor memory cells, wherein the erase operation consists of applying one or more erase pulses to the floating gate transistor memory cells and performing a convergence operation to recover over-erased floating gate transistor memory cells, wherein the convergence operation comprises biasing the body to ground, applying a voltage in a range of 2 to 5 volts to the control gate, and applying a ramped voltage signal having a duration in a range of 10 μs to 100 ms, a final voltage of about 0 volts, and an initial voltage in a range of 2 to 5 volts to the source region.

24. The non-volatile memory device of claim 23 wherein the body is p-type and the channel comprises a p+ region adjacent the drain region.

25. A method of erasing a block of floating gate transistor memory cells comprising:

applying an erase voltage configuration to the block of floating gate transistor memory cells comprising source and drain regions, a channel formed in a body of the transistor between the source and drain regions, a floating gate, and a control gate;

performing a convergence operation on the block of floating gate transistor memory cells to adjust floating gate transistor memory cells that are over-erased during the application of the erase voltage configuration, the convergence operation comprises, biasing the source region of the floating gate transistor memory cells to ground potential, biasing the body to a negative potential, applying a positive voltage pulse having a predetermined duration in the range of 10 μs to 100 ms and an upper voltage level in a range of 2.5 to 5 volts to the drain region, and applying a ramped voltage signal having a duration in a range of 10 μs to 100 ms, a final voltage in a range of 0 to 4 volts, and an initial voltage in a range of −2 to 0 volts to the control gate.

26. The method of claim 25 further comprises programming the block of floating gate transistor memory cells to a high threshold value prior to applying the erase voltage configuration.

27. The method of claim 25 wherein applying the erase voltage configuration comprises performing interactive erase and verify operations.

28. A method of erasing a block of floating gate transistor memory cells comprising:

applying an erase voltage configuration to the block of floating gate transistor memory cells comprising source and drain regions, a channel formed in a body of the transistor between the source and drain regions, a floating gate, and a control gate;

performing a convergence operation on the block of floating gate transistor memory cells to adjust floating gate transistor memory cells that are over-erased during the application of the erase voltage configuration, the convergence operation comprises, floating the source region of the floating gate transistor memory cells, biasing the body to ground, applying a voltage in a range of 6 to 9 volts to the drain region, and applying a ramped voltage signal having a duration in a range of 10 μs to 100 ms, a final voltage in a range of 1 to 4 volts, and an initial voltage of about 0 volts to the control gate.

29. The method of claim 28 further comprises programming the block of floating gate transistor memory cells to a high threshold value prior to applying the erase voltage configuration.

30. The method of claim 28 wherein applying the erase voltage configuration comprises performing interactive erase and verify operations.

31. A method of erasing a block of floating gate transistor memory cells comprising:

applying an erase voltage configuration to the block of floating gate transistor memory cells comprising source and drain regions, a channel formed in a body of the transistor between the source and drain regions, a floating gate, and a control gate;

performing a convergence operation on the block of floating gate transistor memory cells to adjust floating gate transistor memory cells that are over-erased during the application of the erase voltage configuration, the convergence operation comprises, floating the source region of the floating gate transistor memory cells, biasing the body to ground, applying a voltage in a range of 6 to 9 volts to the drain region, and applying a voltage in a range of 0.5 to 3 volts to the control gate.

32. The method of claim 31 further comprises programming the block of floating gate transistor memory cells to a high threshold value prior to applying the erase voltage configuration.

33. The method of claim 31 wherein applying the erase voltage configuration comprises performing interactive erase and verify operations.

34. A method of erasing a block of floating gate transistor memory cells comprising:

applying an erase voltage configuration to the block of floating gate transistor memory cells comprising source and drain regions, a channel formed in a body of the transistor between the source and drain regions, a floating gate, and a control gate;

performing a convergence operation on the block of floating gate transistor memory cells to adjust floating gate transistor memory cells that are over-erased during the application of the erase voltage configuration, the convergence operation comprises, biasing the body to ground, applying a first constant voltage in a range of 2 to 5 volts to the control gate, applying a second constant voltage in a range of 3 to 6 volts to the drain region, and applying a ramped voltage signal having a duration in a range of 10 μs to 100 ms, a final voltage of about 0 volts, and an initial voltage in a range of 2 to 5 volts to the source region.

35. The method of claim 34 further comprises programming the block of floating gate transistor memory cells to a high threshold value prior to applying the erase voltage configuration.

36. The method of claim 34 wherein applying the erase voltage configuration comprises performing interactive erase and verify operations.

* * * * *